(12) United States Patent
Iwawaki et al.

(10) Patent No.: US 7,914,907 B2
(45) Date of Patent: Mar. 29, 2011

(54) LIGHT-EMITTING DEVICE

(75) Inventors: Hironobu Iwawaki, Yokohama (JP); Shinjiro Okada, Kamakura (JP); Takao Takiguchi, Chofu (JP); Satoshi Igawa, Fujisawa (JP); Masashi Hashimoto, Tokyo (JP); Jun Kamatani, Tokyo (JP); Kengo Kishino, Yokohama (JP); Minako Nakasu, Tokyo (JP); Ryota Ooishi, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 298 days.

(21) Appl. No.: 11/570,191

(22) PCT Filed: Sep. 14, 2005

(86) PCT No.: PCT/JP2005/017325
§ 371 (c)(1),
(2), (4) Date: Dec. 7, 2006

(87) PCT Pub. No.: WO2006/035640
PCT Pub. Date: Apr. 6, 2006

(65) Prior Publication Data
US 2007/0184302 A1      Aug. 9, 2007

(30) Foreign Application Priority Data

Sep. 29, 2004  (JP) ................................. 2004-283241
Aug. 12, 2005  (JP) ................................. 2005-234233

(51) Int. Cl.
*H01L 51/52* (2006.01)
(52) U.S. Cl. ........................ 428/690; 313/504; 257/102
(58) Field of Classification Search .................. None
See application file for complete search history.

(56) References Cited

U.S. PATENT DOCUMENTS

| 5,708,130 | A * | 1/1998 | Woo et al. ................. 528/397 |
|---|---|---|---|
| 6,812,497 | B2 | 11/2004 | Kamatani et al. .............. 257/79 |
| 6,838,818 | B2 | 1/2005 | Furugori et al. .............. 313/504 |
| 2002/0106531 | A1* | 8/2002 | Naito ........................... 428/690 |
| 2003/0072964 | A1* | 4/2003 | Kwong et al. ................. 428/690 |
| 2003/0137239 | A1 | 7/2003 | Matsuura et al. ............. 313/503 |
| 2003/0224205 | A1* | 12/2003 | Li et al. ......................... 428/690 |
| 2004/0131880 | A1* | 7/2004 | Zheng et al. .................. 428/690 |
| 2005/0276994 | A1 | 12/2005 | Iwawaki et al. .............. 428/690 |
| 2006/0003171 | A1 | 1/2006 | Igawa et al. .................. 428/447 |
| 2006/0097227 | A1 | 5/2006 | Okajima et al. ......... 252/301.16 |
| 2007/0122652 | A1 | 5/2007 | Hashimoto et al. ........... 428/690 |

FOREIGN PATENT DOCUMENTS

| JP | 2002-280183 | 9/2002 |
|---|---|---|
| JP | 2003-055275 | 2/2003 |
| JP | 2003-68465 | 3/2003 |
| JP | 2003-077673 | 3/2003 |
| JP | 2003-208988 | 7/2003 |
| JP | 2004-277377 | 10/2004 |
| JP | 2005-100957 | 4/2005 |
| JP | 2005-228742 | 8/2005 |
| JP | 2005-276815 | 10/2005 |
| WO | WO 02/02714 A2 | 1/2002 |

OTHER PUBLICATIONS

Kauffman et. al. Electronic Absorption . . . J of Fluorescence vol. 5., No. 3, p. 295-305.*
Scherf al. al. Smeiconducting Polyfluorenes . . . Advanced Materials, 2002, 14, No. 7.p. 477-487.*
O'Brien et al., "Improved Energy Transfer in Electrophosphorescent Devices," *Appl. Phys. Lett.*, vol. 74, No. 3, 442-444 (1999).
Baldo et al., "Very High-efficiency Green Organic Light-emitting Devices Based on Electrophosphorescence," *Appl. Phys. Lett.*, vol. 75, No. 1, 4-6 (1999).
Chen et al., "Recent Developments in Molecular Organic Electroluminescent Materials," *Macromol. Symp.*, vol. 125, 1-48 (1997).
The Patent Office of the People's Republic of China "Notification of First Office Action" Aug. 15, 2008.
S.W. Culligan et al., "Strongly polarized and efficient blue organic light-emitting diodes using monodisperse glassy nematic oligo(fluorine)s," Adv. Mater., vol. 15, No. 14, 2003, pp. 1176-1180, XP002578173—5 pages.
Supplementary European Search Report issued in the counterpart application No. 05785874.8, dated Apr. 29, 2010—6 pages.

* cited by examiner

*Primary Examiner* — D. Lawrence Tarazano
*Assistant Examiner* — Gregory Clark
(74) *Attorney, Agent, or Firm* — Fitzpatrick, Cella, Harper & Scinto (57) ABSTRACT

The present invention provides an organic EL device utilizing phosphorescence which can be driven at a low voltage, which realizes high luminance and high efficiency, and which has a long lifetime. The organic EL device of the present invention includes an organic light-emitting layer composed of at least a host material and a dopant, wherein the dopant is a phosphorescent compound containing a halogen atom, and the host material is a linear aromatic compound having no aromatic substituent at a side thereof.

1 Claim, 1 Drawing Sheet

LIGHT-EMITTING DEVICE

CROSS-REFERENCE TO RELATED APPLICATIONS

This application is a submission to enter the national phase state under 35 U.S.C. §371 of PCT Application No. PCT/JP2005/17325 filed Sep. 14, 2005.

TECHNICAL FIELD

The present invention relates to a light-emitting device using an organic compound. In particular, the present invention relates to an organic electroluminescent device (organic EL device).

BACKGROUND ART

Figure 1A:
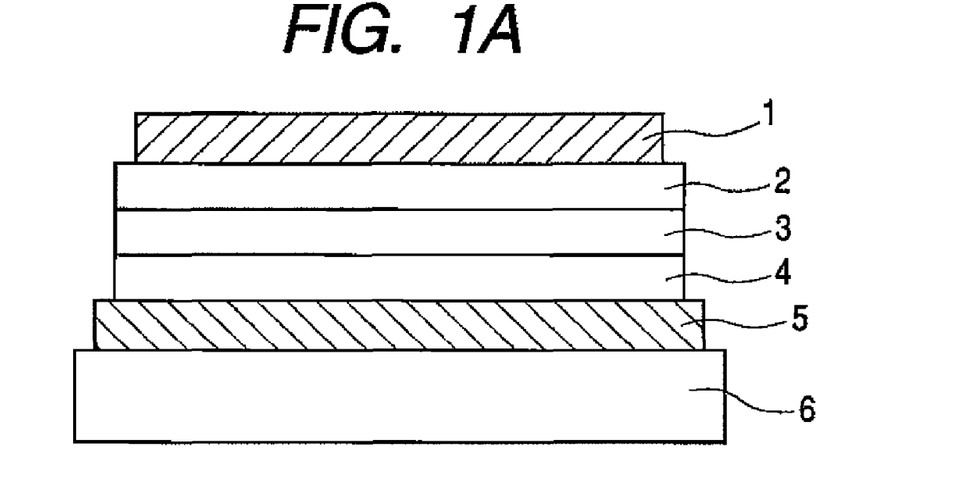
FIGS. 1A and 1B are views each showing an example of a light-emitting device of the present invention.
Figure 1B:
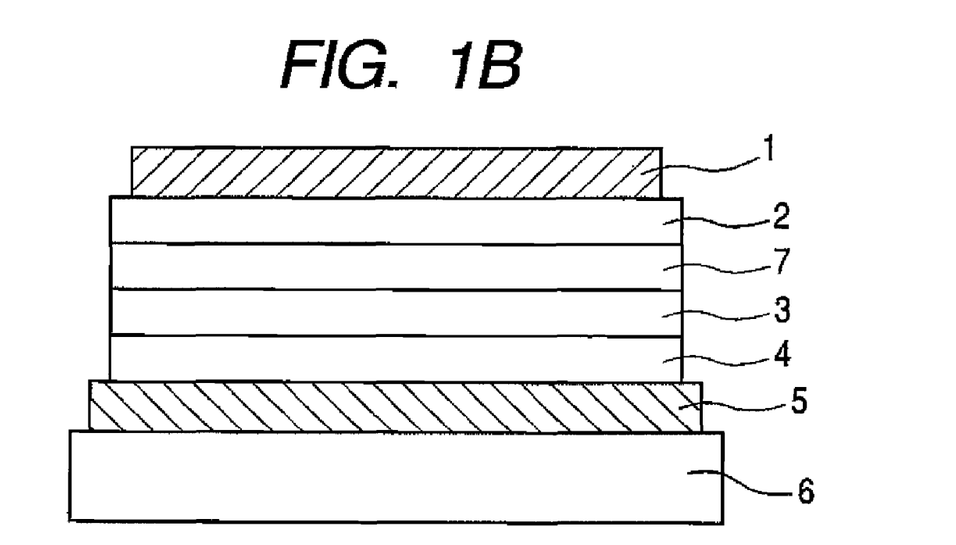

Applied research has been vigorously made on an organic EL device as, a high-speed responsiveness and high-efficiency light-emitting device (Macromol. Symp. 125, 1-48 (1997)). FIGS. 1A and 1B each show the basic structure of the device. As shown in FIGS. 1A and 1B, the organic EL device is generally composed of a plurality of organic layers interposed between a transparent electrode 5 on a transparent substrate 6 and a metal electrode 1.

In FIG. 1A, the organic layers are composed of an electron-transporting layer 2, a light-emitting layer 3, and a hole-transporting layer 4.

For example, ITO having a large work function is used for the transparent electrode 5 to provide good property of injecting a hole from the transparent electrode 5 to the hole-transporting layer 4. A metal material having a small work function such as aluminum, magnesium, or an alloy thereof is used for the metal electrode 1 to provide good property of injecting electrons to the organic layers. Those electrodes each have a thickness in the range of 50 to 200 nm.

For example, an aluminum-quinolinol complex (typified by $Alq_3$ shown below) having electron-transporting and light-emitting properties is used for the light-emitting layer 3. In addition, a material having electron-donating property such as a biphenyl diamine derivative (typified by α-NPD shown below) is used for the hole-transporting layer 4. An oxadiazole derivative or the like can be used for the electron-transporting layer 2.

Fluorescence upon transition of a singlet exciton of a molecule as a light-emitting center to a ground state has been heretofore taken as light emission generally used in an organic EL device. Meanwhile, a device utilizing not fluorescent emission via a singlet exciton but phosphorescence via a triplet exciton has been under investigation ("Improved energy transfer in electrophosphorescent device" (D. F. O'Brien et al., Applied Physics Letters Vol 74, No 3, p 422 (1999)) and "Very high-efficiency green organic light-emitting devices based on electrophosphorescence" (M. A. Baldo et al., Applied Physics Letters Vol 75, No 1, p 4 (1999))). In each of those documents, a four-layer structure composed of organic layers shown in FIG. 1B is mainly used. The four-layer structure is composed of the hole-transporting layer 4, the light-emitting layer 3, an exciton diffusion blocking layer 7, and the electron-transporting layer 2 in this order from the side of an anode. The materials used are the following carrier-transporting materials and phosphorescent materials. Abbreviations of the respective materials are as follows.

Alq3: Aluminum-quinolinol complex
α-NPD: N4,N4'-Di-naphthalen-1-yl-N4,N4'-diphenyl-biphenyl-4,4'-diamine
CBP: 4,4'-N,N'-Dicarbazole-biphenyl
BCP: 2,9-Dimethyl-4,7-diphenyl-1,10-phenanthroline
PtOEP: platinum-octaethylporphyrin complex
Ir(ppy)3: Iridium-phenylpyridine complex High efficiency is obtained in each of "Improved energy transfer in electrophosphorescent device" (D. F. O'Brien et al, Applied Physics Letters Vol 74, No 3, p 422 (1999)) and "Very high-efficiency green organic light-emitting devices based on electrophosphorescence" (M. A. Baldo et al, Applied Physics Letters Vol 75, No 1, p 4 (1999)) when α-NPD was used for the hole-transporting layer 4, Alq$_3$ for the electron-transporting layer 2, BCP for the exciton diffusion blocking layer 7, and CBP as a host material for the light-emitting layer 3 which was mixed with PtOEP or Ir(ppy)$_3$ as a phosphorescent material at a concentration of about 6%.

A phosphorescent material has been attracting considerable attention because it is expected to provide high emission efficiency on principle. The reason for this is that excitons generated by carrier recombination are composed of singlet excitons and triplet excitons, and the ratio between the number of singlet excitons and the number of triplet excitons is 1:3. An organic EL device utilizing a singlet has taken fluorescence upon transition from a singlet exciton to a ground state as light emission. However, on principle, the luminescence yield of the device was 25% of the number of generated excitons, and the value was an upper limit on principle. When phosphorescence from an exciton generated from a triplet is used, an yield at least 3 times as high as that of the above yield is expected on principle. Furthermore, when transfer due to intersystem crossing from a singlet at a higher energy level to a triplet is taken into consideration, a light emission yield 4 times as high as the above yield, that is, a luminescence yield of 100% is expected.

In addition, the development of a host material using a phosphorescent compound as a dopant has been actively made (Japanese Patent Application Laid-Open No. 2003-55275). The development of a phosphorescent compound has also been actively made. The development of an iridium complex containing fluorine as a halogen atom (International Publication No. WO 02/02714) has been made. A device which is formed by introducing a fluorine atom into it to provide a dopant concentration of 20% or more has been proposed.

However, an organic EL device utilizing phosphorescence, the organic EL device using, as a light-emitting material, a phosphorescent compound containing a halogen atom in its molecular structure, involves a problem in that the organic EL device has an extremely short device lifetime, although the reason by which such problem occurs is unclear.

DISCLOSURE OF THE INVENTION

An object of the present invention is to provide an organic EL device utilizing phosphorescence which can be driven at a low voltage, which realizes high luminance and high efficiency, and which has a long lifetime.

The inventors of the present invention have made extensive studies to achieve the above object, thus completing the present invention.

That is, according to one aspect of the present invention, there is provided a light-emitting device including: an anode, a cathode, and an organic light-emitting layer interposed between the anode and the cathode, wherein the organic light-emitting layer is composed of a host material and at least one kind of dopants, the at least one kind of the dopants is a phosphorescent compound containing a halogen atom, and the host material is a linear aromatic compound having no aromatic substituent at a side thereof.

According to the present invention, there can be provided an organic electroluminescent device using, as a light-emitting material, a phosphorescent compound containing a halogen atom, which realizes a low threshold voltage and a long lifetime.

BEST MODE FOR CARRYING OUT THE INVENTION

The light-emitting device of the present invention includes an anode, a cathode, and an organic light-emitting layer interposed between the anode and the cathode. The layer structure of the light-emitting device is not particularly limited, and examples thereof include such structures as shown in FIGS. 1A and 1B. A method of producing the light-emitting device is not limited to vacuum evaporation, and may be a wet method typified by coating.

The light-emitting device of the present invention has an organic light-emitting layer composed of a host material and at least one kind of dopant.

The at least one kind of dopant to be incorporated into the host material is a phosphorescent compound containing a halogen atom. The phosphorescent compound is preferably an iridium complex containing a halogen atom, or more preferably an iridium complex having one or more ligands each having a 1-phenylisoquinoline skeleton with at least one halogen atom as a substituent. Examples of the phosphorescent compound containing a halogen atom to be used in the present invention are shown below.

Ir(4F5mpiq)$_3$

-continued

Ir(4Fpiq)₃

Ir(4Clpiq)₃

Ir(4CF3piq)₃

Ir(4Fpiq)2acac

Ir(46Fppy)₃

Ir(46Fppy)2pic

Ir(4Brpiq)₃

A dopant concentration is not particularly limited, but is preferably 50 wt % or less, or more preferably 5 to 20 wt %.

The phosphorescent compound to serve as a dopant in the present invention has a halogen atom. A halogen atom (especially a fluorine atom) is introduced as a substituent into the phosphorescent compound for the purpose of improving at least one of the ease of controlling an emission wavelength, the suppression of concentration quenching, the ease of vapor deposition, and the like.

However, a phosphorescent compound (more specifically an iridium complex) having such a substituent may involve problems of a reduction in current conductivity, difficulties in reducing a drive voltage and a threshold voltage, and an extremely short device lifetime.

The reason for the extremely short device lifetime has not been currently made clear, but the inventors of the present invention consider, for example, that hopping barrier between carrier molecules is a cause of the extremely short device lifetime.

In particular, for example, an iridium complex containing fluorine having extremely high electronegativity may serve as a trap even when it becomes a charge carrier, to thereby reduce charge conductivity. As a result, a charge balance in a light-emitting layer may be lost to cause a sudden reduction in efficiency. A complex having a chlorine atom or a bromine atom in its molecular skeleton is expected to have lower electrical stability than that of one having a fluorine atom in its molecular skeleton because the chlorine atom or the bromine atom is more weakly bonded than the fluorine atom. As a result, driving at a constant current may cause a sudden reduction in efficiency to thereby additionally shorten a lifetime.

Charge injected into a light-emitting layer may be recombined on a dopant (direction excitation type) or on a host (indirect excitation type). In general, the two processes are expected to occur at a certain ratio in the light-emitting layer. To take light emission of the dopant, ideally, 100% of the charge is recombined on the dopant (direct excitation). Alternatively, the dopant has only to cause smooth energy transfer even when the charge is recombined on the host (indirect excitation). In the case of the direct excitation type, it is disadvantageous to use an electrically unstable dopant because the dopant temporarily becomes a charge carrier. On the other hand, in the case of the indirect excitation type, that is, in the case where energy transfers from the host to the dopant (Förster-type or Dexter-type energy transfer), the time period during which the dopant itself serves as a charge carrier is expected to be shorter.

Therefore, in the case where a dopant having low electrical stability is used, a device will be allowed to emit light for a long time period if a host material capable of realizing Förster-type or Dexter-type energy transfer with ease or with high efficiency can be provided.

The case where a dopant having low electrical stability is used refers to the case where a dopant unstable in a cation state or an anion state is used.

In the present invention, a linear aromatic compound having no aromatic substituent at a side thereof is used as a host material to allow a device containing, as a dopant for a light-emitting layer, a phosphorescent compound containing a halogen atom to be driven at a low voltage, and provide the device with a long lifetime.

Here, the linear aromatic compound is a compound having a plurality of aromatic units bonded mutually, and is a compound whose main skeleton can be said to have a molecular major axis.

When the aromatic units are phenyl rings, a direction between 1- and 4-positions is the major axis.

When the aromatic units are fluorene rings, a direction between 2- and 7-positions is the major axis.

The linear aromatic compound is not necessarily composed of the same kind of aromatic units and may be composed of different kinds of aromatic units bonded mutually. The aromatic units include a phenyl ring, a carbazole ring, and the like.

The term "side" in the linear aromatic compound means a direction intersecting the molecular major axis. If the aromatic units are phenyl rings and are bonded at 1- and 4-positions to another aromatic unit, respectively, the intersecting direction is a direction of any one of 2-, 3-, 5-, and 6-positions. Therefore, in the case where the aromatic units in the linear aromatic compound are phenyl rings, the phrase "having no aromatic substituent at a side" means that there is no aromatic substituent at 2-, 3-, 5-, and 6-positions of the phenyl ring.

If the aromatic units are fluorene rings and are bonded at 2- and 7-positions (2- and 6-positions, 3- and 7-positions, or 3- and 6-positions) to another aromatic unit, respectively, the intersecting direction is a direction of any one of 1-, 4-, 5-, 8-, and 9-positions. Therefore, in the case where the aromatic units in the linear aromatic compound are fluorene rings, the phrase "having no aromatic substituent at a side" means that there is no aromatic substituent at 1-, 4-, 5-, 8-, and 9-positions of the fluorene ring. In the case where the aromatic units in the linear aromatic compound are fluorene rings, the aromatic units are preferably bonded at 2- and 7-positions to another aromatic unit, respectively.

Examples of an aromatic substituent not present in a side of the linear aromatic compound of the present invention include a phenyl ring. The examples further include aromatic groups having a fused ring, such as a carbazole ring, an anthracene ring and a fluorene ring.

The linear aromatic compound of the present invention preferably has 3 or more fluorene rings constituting a major axis thereof. The number of fluorene rings is more preferably 3 to 5. Still more preferably, the linear aromatic compound has 4 or 5 fluorene rings as a main skeleton. When the linear aromatic compound has 3 or more fluorene rings, it hardly crystallizes and hardly causes decomposition or the like at the time of evaporation. A linear aromatic compound having 3 or more fluorene rings does not mean a high-molecular-weight compound. A high-molecular-weight compound is not preferable because it is difficult to remove impurities to be produced at the time of, for example, the synthesis of the compound and the removal of the impurities may be incomplete. The linear aromatic compound of the present invention is a compound having a single molecular weight with no molecular weight distribution.

The linear aromatic compound of the present invention preferably has a glass transition temperature (Tg) of 120° C. or higher. A linear aromatic compound having a single molecular weight without an aromatic substituent at a side thereof and having a molecular major axis composed only of a fluorene ring can exhibit a high glass transition temperature (Tg) of 120° C. or higher.

Specific examples of the linear aromatic compound of the present invention will be shown below; provided, however, that the present invention is not limited to the examples.

Compound 1

Compound 2

Compound 3

Compound 4

Compound 5

Compound 6

-continued

Compound 15

Compound 16

Compound 17

Compound 18

Compound 19

Compound 20

Compound 21

Compound 22

Compound 23

-continued

Compound 24

Compound 25

Compound 26

Compound 27

Compound 28

Compound 29

Compound 30

The light-emitting device with high efficiency according to the present invention can be applied to products requiring energy savings and high luminance. Applied examples of the light-emitting device include light sources for a display apparatus, a lighting system and a printer; and a backlight for a liquid crystal display apparatus. A flat panel display having energy savings, high visibility, and lightweight can be achieved when the device of the present invention is applied to a display apparatus. In the case of a light source for a printer, a laser light source portion of a laser beam printer currently in active use can be replaced with the light-emitting device of the present invention. Devices that can be independently addressed are arranged on an array and desired exposure is carried out on a photosensitive drum, whereby an image is formed. The use of the device of the present invention significantly reduces an apparatus volume. An energy saving effect of the present invention is expected to be exerted on a lighting system or a backlight.

First, the materials used for Examples and Comparative Examples are shown.

Example 1

In this example, a light-emitting device having 3 organic layers shown in FIG. 1A was used as a device structure.

ITO (transparent electrode 5) having a thickness of 100 nm was patterned onto a glass substrate (transparent substrate 6) to have an opposing electrode area of 3 mm². The following organic layers and electrode layers were continuously formed onto the ITO substrate by vacuum deposition by using resistance heating in a vacuum chamber at $10^{-5}$ Pa.

Hole-transporting layer 4 (20 nm): FL03
Light-emitting layer 3 (30 nm): [host] Compound 2, [dopant (dopant concentration 10 wt %)] Ir(4F5mpiq)₃
Host material: Compound 2, dopant
Electron-transporting layer 2 (45 nm): Bphen
Metal electrode layer 1 (1 nm): KF
Metal electrode layer 1 (100 nm): Al Table 1 shows the luminance half hour (hr) when driven at a constant current (100 mA/cm²) and threshold voltage (voltage capable of causing a current having a current density of 0.1 mA/cm² to flow) of the obtained device. From an emission spectrum, it was confirmed that red light emission was caused at λmax=610 nm by Ir(4F5mpiq)₃.

Comparative Examples 1 to 4

Light-emitting devices were produced in the same manner as in Example 1 except that a host material for a light-emitting layer was changed to a host material shown in Table 1.

The obtained devices were evaluated in the same manner as in Example 1. Table 1 shows the results. From an emission spectrum, it was confirmed that red light emission was caused at λmax=610 nm by Ir(4F5mpiq)₃.

Table 1 shows that the device of Example 1 has a device lifetime 55 to 550 times the device lifetimes of the devices of Comparative Examples 1 to 4 and has a threshold voltage lower than the threshold voltages of the devices of Comparative Examples 1 to 4 by about 0.8 to 0.9 V.

As described above, a threshold voltage can be lowered, and a device lifetime can be lengthened, by doping a linear aromatic compound having a single molecular weight without an aromatic side substituent with an iridium complex containing a fluorine atom.

Example 2 and Comparative Example 5

A light-emitting device was produced in the same manner as in Example 1 except that a host material and a dopant for a light-emitting layer were changed to those shown in Table 1.

The obtained device was evaluated in the same manner as in Example 1. Table 1 shows the results. From an emission spectrum, it was confirmed that light emission was caused at λmax=610 nm by Ir(4Clpiq)$_3$.

The luminance half hour in Comparative Example 5 was 0.05 hr. In contrast, the luminance half hour in Example 2 was 0.3 hr, which is 60 times as high as that of Comparative Example 5. The current density used here was 100 mA/cm$^2$, which is about 25 times as high as a current density to be generally used. Ir(4Clpiq)$_3$ used was an unsublimated purified product. The device lifetime is susceptible to improvement because impurities greatly affecting the device lifetime cannot be completely removed from the product. The threshold voltage in Example 2 was found to be lower than that in Comparative Example 5 by 0.8 V.

As described above, the use of an iridium complex containing a chlorine atom as a dopant also has been found to have an effect on a device lifetime.

Example 3

A light-emitting device was produced in the same manner as in Example 1 except that a dopant for a light-emitting layer was changed to that shown in Table 1.

TABLE 1

| | Host material | Dopant/ concentration | Luminance half hour (hr) | Threshold voltage (0.1 mA/cm$^2$) |
|---|---|---|---|---|
| Example 1 | Compound 2 | Ir(4F5mpiq)$_3$/ 10 wt % | 550 | 2.8 |
| Comparative Example 1 | CBP | Ir(4F5mpiq)$_3$/ 10 wt % | 5 | 3.6 |
| Comparative Example 2 | TCTA | Ir(4F5mpiq)$_3$/ 10 wt % | 5 | 3.6 |
| Comparative Example 3 | TFB4 | Ir(4F5mpiq)$_3$/ 10 wt % | 10 | 3.6 |
| Comparative Example 4 | FL03 | Ir(4F5mpiq)$_3$/ 10 wt % | 1 | 3.7 |
| Example 2 | Compound 2 | Ir(4C1piq)$_3$/ 10 wt % | 0.3 | 2.8 |
| Comparative Example 5 | CBP | Ir(4C1piq)$_3$/ 10 wt % | 0.05 | 3.6 |
| Example 3 | Compound 2 | Ir(4F5mpiq)$_3$/ 4 wt % Ir(bq)$_3$/8 wt % | 700 | 2.6 |

Synthesis Example 1

Synthesis of Exemplified Compound 21

The obtained device was evaluated in the same manner as in Example 1. Table 1 shows the results. From an emission spectrum, it was confirmed that main light emission was caused at $\lambda_{max}$=610 nm by Ir(4F5 mpiq)$_3$.

As described above, it was confirmed that an assist doping device (assist compound: Ir(bq)$_3$) obtained by doping a linear aromatic compound having a single molecular weight without an aromatic side substituent with an iridium complex containing a fluorine atom had an excellent effect on the device lifetime and threshold voltage. The assist compound used herein is a compound which is added to an organic EL device for the purpose of promoting the energy transfer from a host to a dopant, adjusting an amount of carriers such as holes or electrons in the light-emitting layer. An organic EL device containing the assist compound is herein referred to as an assist doping device.

8.19 g (25.6 mmole) of 2-iodo-(9,9-Dimethyl)-fluorene, 5.18 g (28.1 mmole) of dibutyl vinylborate, 0.26 g of Pd(PPh$_3$)$_4$, 60 ml of toluene, 30 ml of ethanol, and 60 ml of a 2M sodium carbonate aqueous solution were fed into a 300-ml round-bottomed flask, and the whole was stirred at 80° C. for 8 hours in a stream of nitrogen. After the completion of the reaction, the reaction liquid was extracted with toluene. The organic layer was washed with water and dried with magnesium sulfate, followed by evaporation to dryness under reduced pressure. The resultant was purified by means of silica gel column chromatography (eluent: hexane/ethyl acetate=10/1) to yield 3.5 g of 2-vinyl-(9,9-Dimethyl)-fluorene (62.1% yield). 1.05 g (4.77 mmole) of the obtained 2-vinyl-(9,9-Dimethyl)-fluorene and 10 ml of THF were fed into a 100-ml round-bottomed flask, and the whole was cooled to −5° C. in a stream of nitrogen. 6.21 ml of a 0.5M 9-BBN solution were slowly added dropwise to the resultant, and the whole was stirred at 0° C. for 2 hours. After that, 4.8 ml of a 3N aqueous solution of NaOH, 130 mg of $PdCl_2$ (dppf), and 956 mg (2.144 mmol) of 2,2'-diodo-(9,9-Dimethyl)-fluorene were added to the resultant, and the whole was stirred at 60° C. for 7 hours. After the completion of the reaction, the reaction liquid was extracted with toluene. The organic layer was washed with water and dried with magnesium sulfate, followed by evaporation to dryness under reduced pressure. Then, the resultant was recrystallized with toluene/hexane. After the obtained crystal had been removed by filtration, the remainder was purified by means of mother liquor silica gel column chromatography (eluent: hexane/ethyl acetate=5/1→1/1), recrystallized with toluene, dried in a vacuum, and subjected to sublimation purification to yield 272 mg of Compound 21 (20% yield).

634.4 as M+ of this compound was observed by means of matrix assisted laser desorption/ionization-time of flight mass spectrometry (MALDI-TOF MS).

$^1$H NMR ($CDCl_3$, 400 MHz) σ (ppm): 7.68 (d, 2H), 7.60 (m, 4H), 7.41 (d, 2H), 7.31 (m, 4H), 7.22 (d, 4H), 7.15 (t, 4H), 3.04 (s, 8H), 1.46 (s, 12H), 1.42 (s, 6H)

Example 4

A light-emitting device structure used in Example 4 was as follows.
Hole-transporting layer (40 nm): FL03
Light-emitting layer (20 nm): Compound 21+Ir(46Fppy)$_3$ 8 wt %
Electron-transporting layer (20 nm): Bphen
Metal electrode layer (1 nm): KF
Metal electrode layer (100 nm): Al The device of this example had an efficiency of 6.2 cd/A (200 cd/m$^2$) and an emission wavelength of 460 nm. When continuous energization was performed on the device, stable light emission was observed.

Synthesis Example 2

Synthesis of Exemplified 6.38 g (10 mmole) of Synthesis Intermediate 1, 6.97 g (20 mmole) of Synthesis Intermediate 2, 1 g of Pd(PPh$_3$)$_4$, 50 ml of toluene, 25 ml of ethanol, and 50 ml of a 2M sodium carbonate aqueous solution were fed into a 200-0 ml round-bottomed flask, and the whole was stirred at 80° C. for 8 hours in a stream of nitrogen. After the completion of the reaction, the resultant was extracted with toluene. Then, the organic layer was washed with water and dried with magnesium sulfate. The resultant was purified by means of silica gel chromatography (eluent: hexane/ethyl acetate=3/1), and the obtained crystal was dried in a vacuum at 120° C. and subjected to sublimation purification to yield 5.5 g of Exemplified Compound 23 (66.5% yield).

826.5 as M+ of this compound was observed by means of matrix assisted laser desorption/ionization-time of flight mass spectrometry (MALDI-TOF MS).

In addition, the structure of this compound was identified by NMR measurement.

$^1$H NMR ($CDCl_3$, 400 MHz) σ (ppm): 7.61-7.86 (m, 20H), 7.36 (m, 6H), 2.11 (m, 8H), 1.67 (s, 12H), 0.40 (t, 12H)

In addition, this compound had a glass transition temperature Tg of 149° C.

Example 5

A light-emitting device structure used in Example 5 is as follows.
Hole-transporting layer (40 nm): FL03
Light-emitting layer (25 nm): Compound 23+Ir(4F5mpiq)$_3$ 14 wt %
Electron-transporting layer (50 nm): Bphen
Metal electrode layer (1 nm): KF
Metal electrode layer (100 nm): Al The device of this example had an efficiency of 15.8 cd/A, 13.6 lm/W (600 cd/m$^2$) and an emission wavelength of 605 nm. In addition, the device showed a luminance half hour (hr) of 500 hr and a threshold voltage of 2.8 V when driven at a constant current (100 mA/cm$^2$).

Compound 23

Synthesis Intermediate 1          Synthesis Intermediate 2

Synthesis Example 3

Synthesis of Exemplified

Compound 25

7.37 g (10 mmole) of Synthesis Intermediate 3, 6.97 g (20 mmole) of Synthesis Intermediate 2, 1 g of Pd(PPh$_3$)$_4$, 50 ml of toluene, 25 ml of ethanol, and 50 ml of a 2M sodium carbonate aqueous solution were fed into a 200-ml round-bottomed flask, and the whole was stirred at 80° C. for 8 hours in a stream of nitrogen. After the completion of the reaction, the resultant was extracted with toluene. Then, the organic layer was washed with water and dried with magnesium sulfate. The resultant was purified by means of silica gel chromatography (eluent: hexane/ethyl acetate=3/1), and the obtained crystal was dried in a vacuum at 120° C. to yield 5.2 g of Exemplified Compound 25 (51.0% yield).

1018.6 as M+ of this compound was observed by means of matrix assisted laser desorption/ionization-time of flight mass spectrometry (MALDI-TOF MS).

In addition, the structure of this compound was identified by NMR measurement.

$^1$H NMR (CDCl$_3$, 400 MHz) σ (ppm): 7.62-7.87 (m, 26H), 7.36 (m, 6H), 2.11 (m, 8H), 1.67 (s, 18H), 0.41 (t, 12H)

Example 6

A light-emitting device was produced in the same manner as in Example 5 except that the host material used for Example 5 was changed from Compound 23 to Compound 25.

Light emission having an emission wavelength of 605 nm was observed from the device of this example. When continuous energization was performed on the device, stable light emission was observed.

Synthesis Example 4

Synthesis of Exemplified

Compound 26

6.58 g (10 mmole) of Synthesis Intermediate 4, 6.97 g (20 mmole) of Synthesis Intermediate 2, 1 g of Pd(PPh$_3$)$_4$, 50 ml of toluene, 25 ml of ethanol, and 50 ml of a 2M sodium carbonate aqueous solution were fed into a 200-ml round-bottomed flask, and the whole was stirred at 80° C. for 8 hours in a stream of nitrogen. After the completion of the reaction, the resultant was extracted with toluene. Then, the organic layer was washed with water and dried with magnesium sulfate. The resultant was purified by means of silica gel chromatography (eluent: hexane/ethyl acetate=3/1), and the obtained crystal was dried in a vacuum at 120° C. to yield 5.6 g of Exemplified Compound 26 (70.1% yield).

798.4 as M+ of this compound was observed by means of matrix assisted laser desorption/ionization-time of flight mass spectrometry (MALDI-TOF MS).

In addition, the structure of this compound was identified by NMR measurement.

$^1$H NMR (CDCl$_3$, 400 MHz) σ (ppm): 7.62-7.85 (m, 20H), 7.36 (m, 6H), 2.11 (m, 4H), 1.66 (s, 12H), 1.58 (s, 6H), 0.41 (t, 6H)

Example 7

A light-emitting device was produced in the same manner as in Example 5 except that the host material used for Example 5 was changed from Compound 23 to Compound 26.

Light emission having an emission wavelength of 605 nm was observed from the device of this example. When continuous energization was performed on the device, stable light emission was observed.

This application claims priority from Japanese Patent Application No. 2004-283241 filed Sep. 29, 2004, and Japanese Patent Application No. 2005-234233 filed Aug. 12, 2005, which are hereby incorporated by reference herein.

The invention claimed is:

1. A light-emitting device comprising: a pair of electrodes, and a light-emitting layer containing an organic compound interposed between said pair of electrodes, wherein the light-emitting layer includes a dopant material and a host material, wherein the host material is a compound represented by the following structure:

(III)

and wherein the dopant material is a phosphorescent compound represented by the following formula:

Ir(4F5mpiq)$_3$

* * * * *